(12) United States Patent
Ohtani et al.

(10) Patent No.: US 6,674,567 B2
(45) Date of Patent: Jan. 6, 2004

(54) RAMAN EXCITATION CONTROL METHOD AND OPTICAL TRANSMISSION SYSTEM USING THE SAME

(75) Inventors: Toshihiro Ohtani, Sapporo (JP); Futoshi Izumi, Kawasaki (JP); Shota Mori, Kawasaki (JP); Tsukasa Takahashi, Sapporo (JP); Hideki Kobayashi, Sapporo (JP)

(73) Assignee: Fujitsu Limited, Kawasaki (JP)

(*) Notice: Subject to any disclaimer, the term of this patent is extended or adjusted under 35 U.S.C. 154(b) by 16 days.

(21) Appl. No.: 09/931,078

(22) Filed: Aug. 17, 2001

(65) Prior Publication Data

US 2002/0149841 A1 Oct. 17, 2002

(30) Foreign Application Priority Data

Feb. 23, 2001 (JP) .................. 2001-049057

(51) Int. Cl.[7] .................................. H01S 3/00
(52) U.S. Cl. ......................................... 359/334
(58) Field of Search ................... 359/334; 372/38.06

(56) References Cited

U.S. PATENT DOCUMENTS

| | | | |
|---|---|---|---|
| 6,292,288 B1 | * | 9/2001 | Akasaka et al. ............ 359/334 |
| 6,462,861 B2 | * | 10/2002 | Ohshima et al. ............ 359/334 |
| 6,512,628 B1 | * | 1/2003 | Terahara et al. ............ 359/334 |
| 2001/0040719 A1 | * | 11/2001 | Okuno et al. ................ 359/334 |
| 2002/0041429 A1 | * | 4/2002 | Sugaya et al. ............... 359/334 |
| 2002/0044336 A1 | * | 4/2002 | Tanaka et al. ............... 359/334 |
| 2002/0114060 A1 | * | 8/2002 | Kobayashi et al. .......... 359/334 |
| 2002/0118442 A1 | * | 8/2002 | Ghera et al. ................. 359/334 |

FOREIGN PATENT DOCUMENTS

| | | | |
|---|---|---|---|
| JP | 05-021881 | 1/1993 | ........... H01S/3/131 |
| JP | 05-289127 | 11/1993 | ............. G02F/1/35 |
| JP | 06-164021 | 6/1994 | ............. H01S/3/00 |
| JP | 2000-098433 | 4/2000 | ............. G02F/1/35 |
| JP | 2001-007768 | 1/2001 | ........... H04B/10/17 |

* cited by examiner

*Primary Examiner*—Thomas G. Black
*Assistant Examiner*—Deandra M. Hughes
(74) *Attorney, Agent, or Firm*—Staas & Halsey LLP

(57) ABSTRACT

A Raman excitation control method enabling to reduce the number of couplers and photodetectors (PD) for providing an optical transmission unit with reduced cost. The method is provided for use in optical amplification to amplify an optical signal using Raman excitation light fed into an optical transmission line. A backward light of a laser diode producing the Raman excitation light is monitored by an optical back power monitor. The monitored power value is compared with an initial set value stored in a memory for the laser diode. Based on this comparison result, a feedback control is performed against the light emission power of the laser diode.

18 Claims, 16 Drawing Sheets

FIG. 13
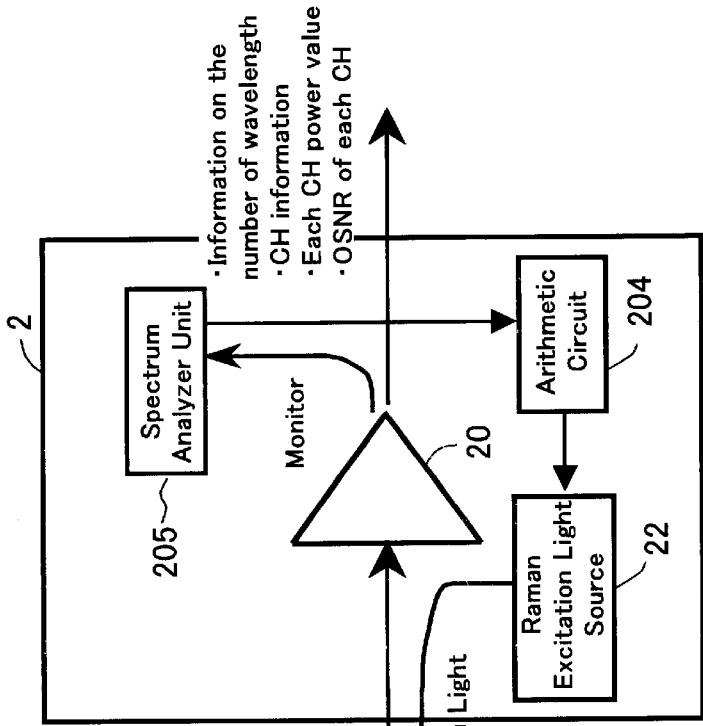
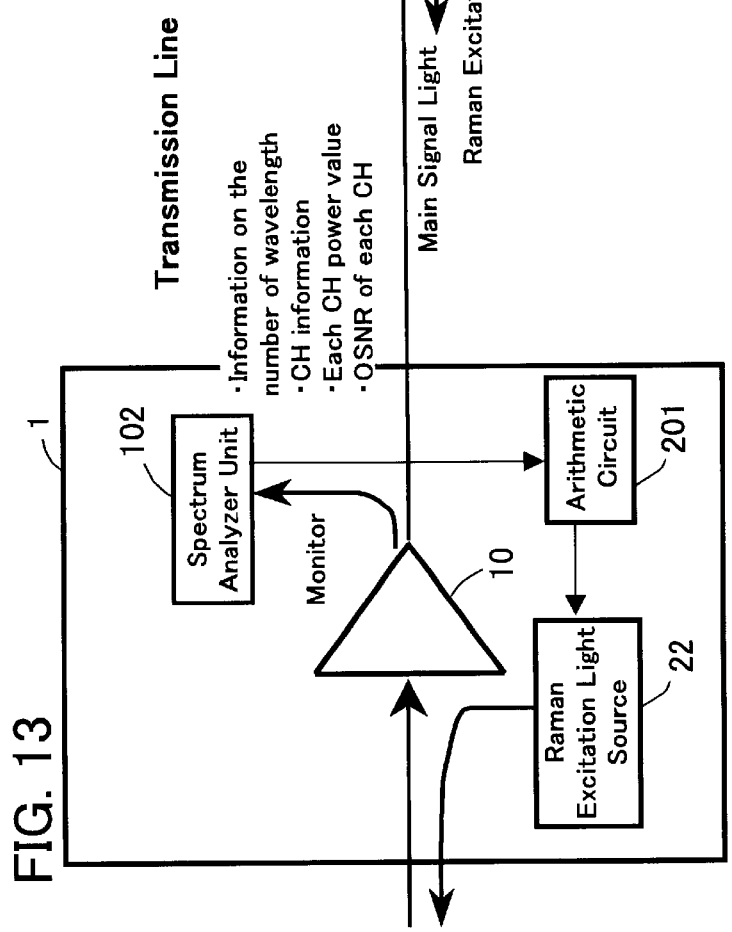

RAMAN EXCITATION CONTROL METHOD AND OPTICAL TRANSMISSION SYSTEM USING THE SAME

FIELD OF THE INVENTION

The present invention relates to a Raman excitation control method and optical transmission system using the same.

BACKGROUND OF THE INVENTION

In FIG. 1, there is shown a configuration example of optical transmission system using optical amplification by means of Raman excitation control. In the system shown in this figure, an optical amplification system 1 is connected to an oppositely located optical amplification system 2 through a bi-directional optical transmission line 3.

For example, in FIG. 1, an optical signal is fed into an optical transmission line 3 through an optical amplifier 10 constituted by Erbium-doped fiber in optical amplification system 2, reaching an optical amplifier 20 in optical amplification system 2. Here, optical amplifier 20 is also constituted by Erbium-doped fiber.

On the contrary, an optical signal from optical amplification system 2 is fed into optical transmission line 3 through an optical amplifier 21, reaching an optical amplifier 11 in optical amplification system 1.

Bi-directional optical transmission line 3 connecting optical amplification system 1 with optical amplification system 2 has a transmission distance of approximately 200 km. For this purpose, optical amplification technology using Raman excitation light source has been introduced so that the optical signal is transmitted with a sufficient gain from optical amplification system 1 to optical amplification system 2, and oppositely from optical amplification system 2 to optical amplification system 1.

This optical amplification using Raman excitation light source is a technology in which the optical transmission line is utilized as an optical amplifier, which is similar to the Erbium-doped fiber amplification used for optical amplifiers 10, 21, 20 and 11. For this purpose, as shown in FIG. 1, there are provided Raman excitation light sources 12, 22 so as to perform backward excitation against optical signals for transmission.

In FIG. 2, there is shown a relation between the wavelengths of Raman excitation light and the gains. The gain produced by Raman amplification gradually increases from Raman excitation light wavelength I. In the case of 1550 nm band, the gain characteristic becomes maximum at the wavelength approximately 110 nm longer than the wavelength I. Accordingly, the Raman excitation light wavelength I is determined so that the optical wavelength of a main signal II is allocated in the area in which the maximum gain is produced.

In recent years, a wavelength-multiplexing optical transmission system using a plurality of main signals has been introduced. In such a system, a plurality of main signals are allocated in a main signal wavelength area. A plurality of Raman excitation light wavelengths are provided corresponding to the main signals.

In FIG. 3, there is shown an amplification gain characteristic produced by a plurality of Raman excitation lights. Corresponding to a plurality of main signal wavelengths II-1 to II-4, a plurality of laser diodes LD1 to LD4 are provided for generating a plurality of Raman excitation light wavelengths I-1 to I-4.

In view of the total gain characteristic in the above-mentioned case, superimposed gain of the plurality of wavelengths becomes larger as the wavelength becomes shorter. As a result, when assuming each output power of laser diodes LD1 to LD4 for producing excitation light is identical, superimposed total gain becomes different depending on the combinations of different wavelengths. This produces a tilt as shown 'A' in FIG. 3. To cope with this problem in actual implementation, each output power of laser diodes LD1 to LD4 for producing excitation light is individually monitored to adjust so that the tilt may not be produced between each main signal, thus producing substantially flat gain.

Another problem is that, in case of multiple wavelengths, signal-to-noise (SN) ratio disperses depending on channels CH, resulting in deterioration of transmission quality as a whole.

In order to compensate this, a weighted power is applied to each signal in a transmission side to improve SN ratio. This control is called as the pre-emphasis control.

Also, there may be a case that the SN ratio becomes deteriorated unintentionally depending on the shape of the tilt in the above-mentioned Raman amplification. To cope with this in the conventional system, there may be introduced a method shown in FIG. 4 to compensate the tilt produced in total gain.

In FIG. 4, an example of the compensation method is now assumed, which is applicable in a conventional system when the tilt is produced in total gain. Especially in FIG. 4, there are shown configuration examples of a unit of optical amplifier 20 (hereafter referred to as optical amplification unit 20) of FIG. 1 and a unit of Raman excitation light source 22 (hereafter referred to as Raman excitation light source unit 22).

In FIG. 4, in order to conduct power control of each laser diode LD1 to LD4 for producing excitation light, there are provided couplers (CPL) 201, 221 to 223 and photodetectors (PD) 224 to 227 for monitoring the light power of each wavelength, in Raman excitation light source unit 22 and optical amplification unit 20. In optical amplification unit 20, excitation light is multiplexed into optical transmission line 3. Also main signal light is received and extracted.

Excitation light emitted by each laser diode LD1 to LD4 with power control is multiplexed in coupler (CPL) 221. Before the excitation light is output to optical transmission line 3 through optical amplification unit 20, total power is monitored by a photodetector (PD) 220 provided in Raman excitation light source unit 22 for controlling the output.

Here, according to the assumed configuration shown in FIG. 4, the following problems may be pointed out.

(1) a large number of couplers CPL and photodetectors PD are required for monitoring total and individual power of excitation light, which brings about increase of equipment cost.

(2) In Raman amplification method requiring high output power for transmission, an important point is how a loss to be produced in the outputs from laser diodes LD1 to LD4 for producing excitation light before reaching optical transmission line 3 can be eliminated. However the assumed configuration shown in FIG. 4, the loss of the outputs from laser diodes LD1 to LD4 produced before reaching optical transmission line 3 comes to 3 to 4 dB.

If a coupler CPL of which branching ratio is approximately 100:1 (=20 dB) is used, a power of 0 to 10 dBm (=1 to 10 mW) is consumed in a photodetector (PD) for monitoring, which produces a great disadvantage.

(3) A coupler/PD portion having the ratio of 100:1 (=20 dB) produces a dispersion of ±1 dB, in the worst case, against the monitoring value a teach PD. This is caused by various dispersions in the branching ratio of the coupler, loss of the coupler itself, a splice connection loss in manufacturing, Quantum Efficiency of PD, etc. Especially, when monitoring the Raman excitation light multiplexed by a coupler (i.e. monitoring by photodetector 220 or 202 in FIG. 4), there exists a dispersion of power in each wavelength input to photodetector 220 or 202 for monitoring.

Therefore, it is difficult to monitor total power accurately. In general, a variation of 1 dB in the excitation light power corresponds to a variation of 2 to 3 dB in the gain in the case of Raman excitation (when a backward excitation shown in FIG. 1 is applied), although the above figure depends on excitation light power or transmission distance. As a result, in the method shown in FIG. 4, it is difficult to control total power value using feedback control.

(4) Each laser diode LD outputs the power of approximately 15 to 25 dBm in maximum per diode, and the power of multiplexed wave generated by a plurality of laser diodes LD reaches as much as 20 to 30 dBm. In photodetectors 220, 202 for monitoring this, a wide dynamic range from output 0→safety light level→maximum power is required.

Assuming that 4 V corresponds to a full range and is 30 dBm (=1,000 mW), a monitored voltage of the safety light level (in the order of 3 to 5 dBm=2 to 3.2 mW) is as small produce a large readout error and therefore it is difficult to control safety light level with required accuracy.

(5) In the assumed configuration shown in FIG. 4, a large number of components are required from the output portion of laser diodes LD1 to LD4 to the transmission portion of excitation light to optical transmission line 3. These components include an optical system consisting of lens for laser diode module, etc., couplers, photodiodes PD for monitoring, splices, connector joints, etc. When a failure occurs in any of these components, the normal control becomes lost. In such a system, therefore, expecting high reliability may become difficult.

(6) A dynamic range in the input signal of optical amplification unit 20 is several decibels. It is however probable, when the main signal level exceeds the upper limit or the lower limit of the dynamic range, transmission quality may be deteriorated (in view of the noise figure characteristic NF, etc.)

SUMMARY OF THE INVENTION

Accordingly, it is an object of the present invention to provide a method for Raman excitation control and optical transmission system using the method to solve the aforementioned problems (1) to (6).

According to the present invention, a Raman excitation control method and optical transmission system using this control method aims at Raman excitation control for use in optical signal amplification by Raman excitation light fed into a transmission line.

The method includes the steps of detecting with a back power monitor backward Raman excitation lights produced by a laser diode circuit; and controlling light emission power of the laser diode circuit according to level of the detected backward lights the back power monitor.

As a preferred embodiment of the present invention, the laser diode circuit includes a plurality of laser diodes, which produce Raman excitation lights having respectively different wavelengths and in the step of detecting, the back power monitor circuit detects the back power lights produced by the plurality of laser diodes and in the step of controlling, light emission power of each of the laser diodes is controlled according to each of the back power lights detected.

As another preferred embodiment of the present invention, a Raman excitation control method for use in optical signal amplification by Raman excitation light fed into a transmission line includes the steps of: detecting with a power monitor a Raman excitation light produced by a laser diode; comparing the power value detected by the power monitor with an initial set data for the laser diode producing the Raman excitation light being stored in a memory; and controlling light emission power of the laser diode according to the result of the comparison.

As still another preferred embodiment of the present invention, a Raman excitation control method for use in optical signal amplification by Raman excitation light fed into a transmission line includes the steps of: detecting with a power monitor Raman excitation lights having different wavelengths produced by a plurality of laser diodes; comparing respective power values detected by the power monitor with initial set data stored in a memory corresponding to each of the plurality of laser diodes producing the Raman excitation lights; and performing a feedback control of light emission power of each plurality of laser diodes according to the result of the comparison.

Further scopes and features of the present invention will become more apparent by the following description of the embodiments with the accompanied drawings.

BRIEF DESCRIPTION OF THE DRAWINGS

FIG. 13 shows another embodiment in regard to the transmission of wavelength information currently used.

DETAILED DESCRIPTION OF THE PREFERRED EMBODIMENTS

Figure 1:
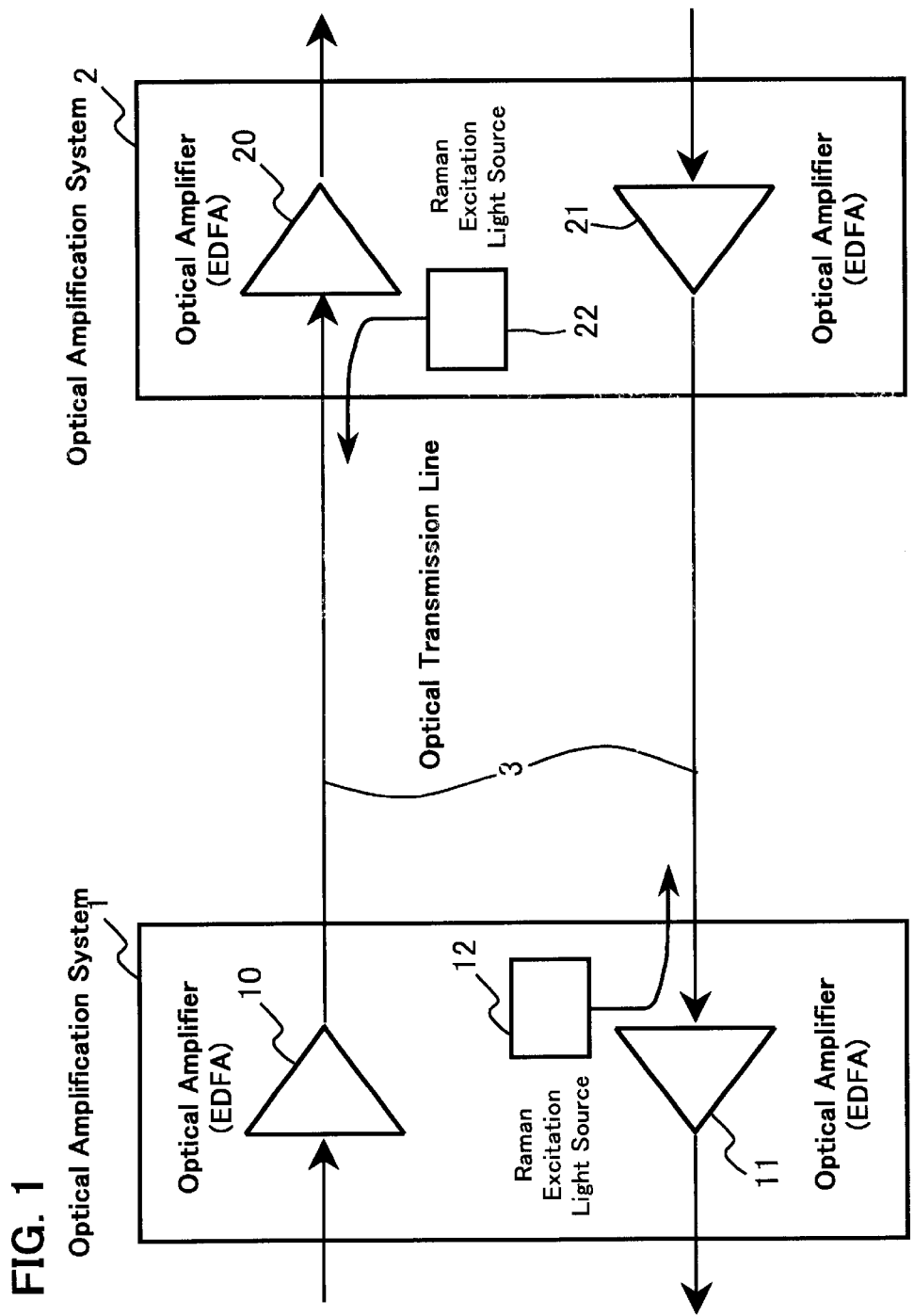
FIG. 1 shows a configuration example of an optical transmission system using optical amplification by means of Raman excitation control.
Figure 2:
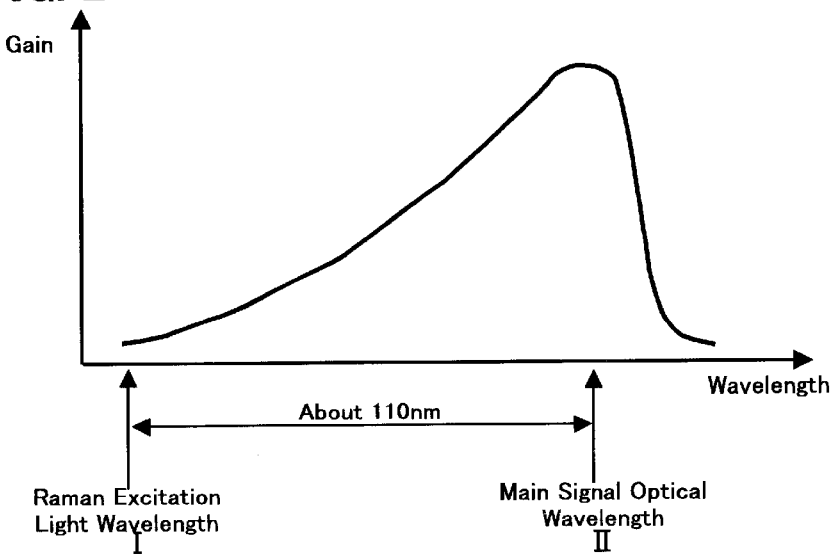
FIG. 2 shows a diagram illustrating the relation between wavelengths of Raman excitation light and amplification gains.
Figure 3:
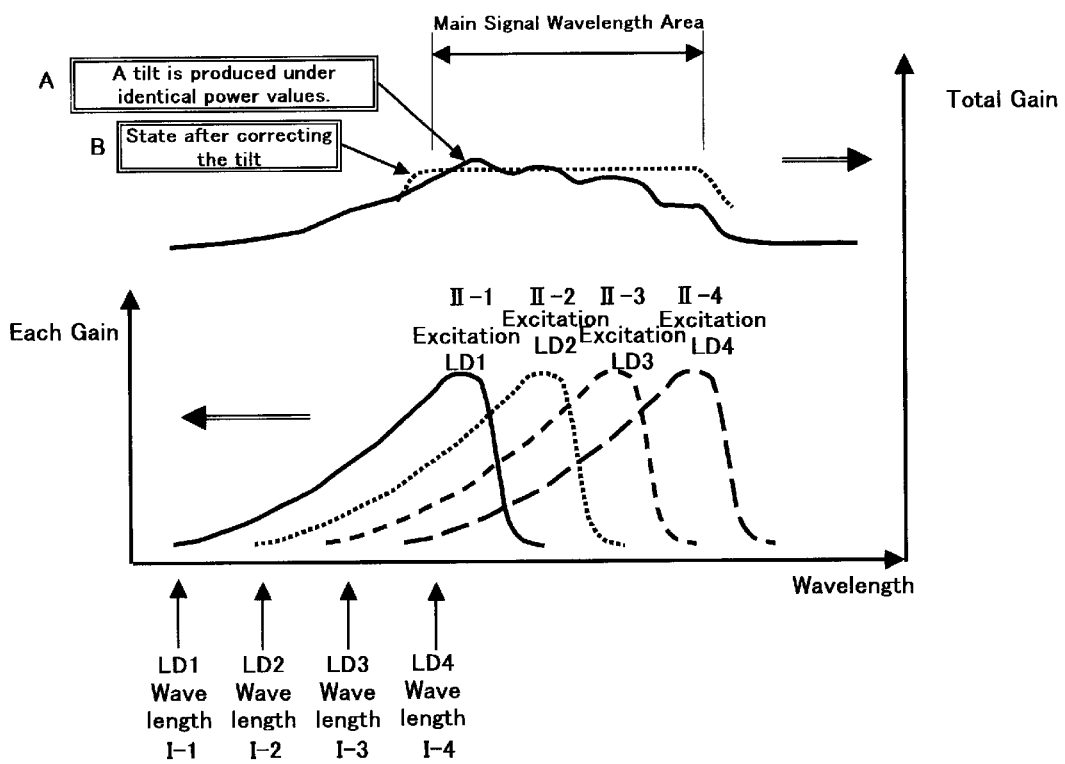
FIG. 3 shows a diagram illustrating an amplification gain characteristic produced by a plurality of Raman excitation lights.
Figure 4:
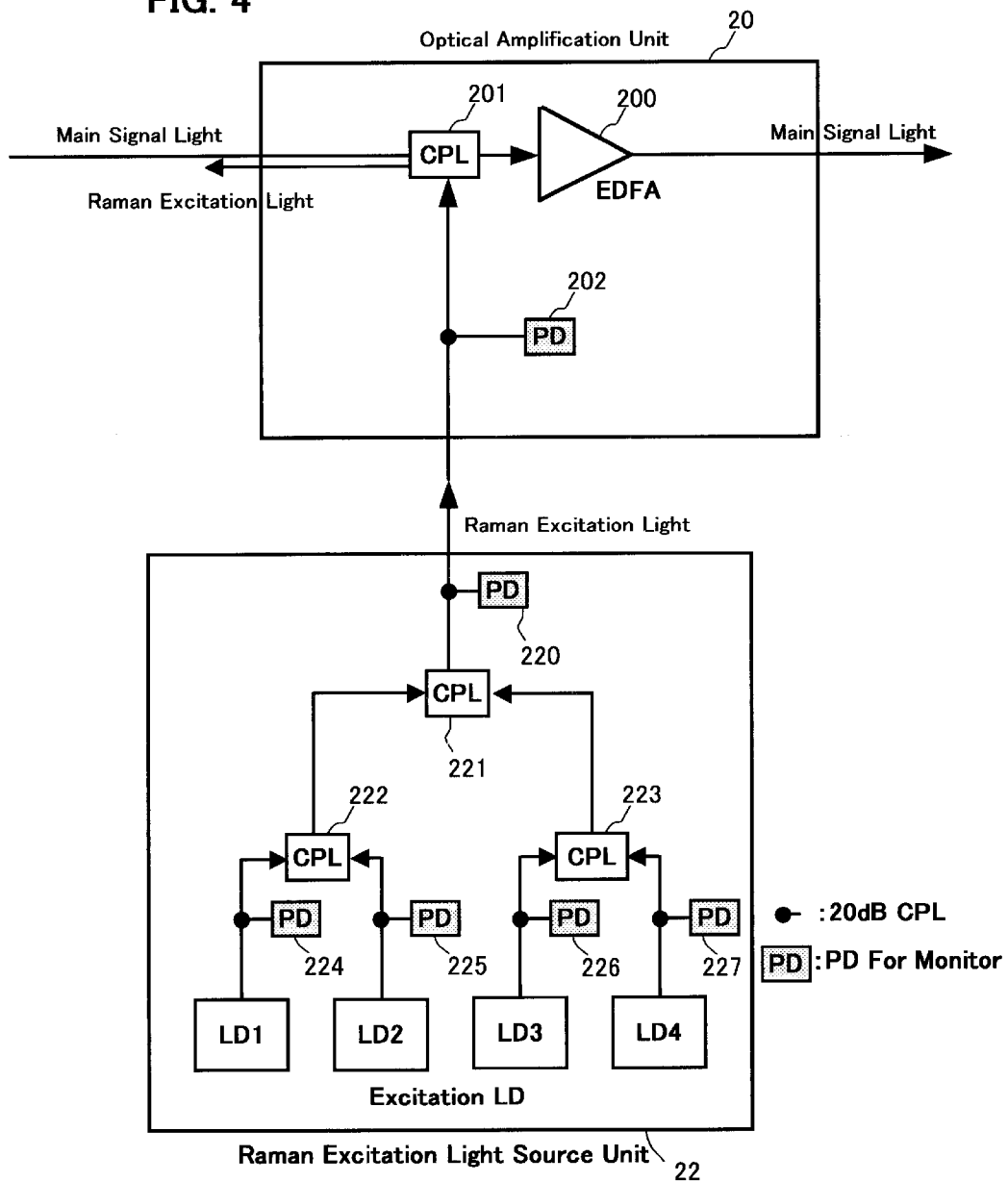
FIG. 4 shows a diagram illustrating an assumed compensation method in a conventional system against the tilt produced in the total gain.
Figure 5:
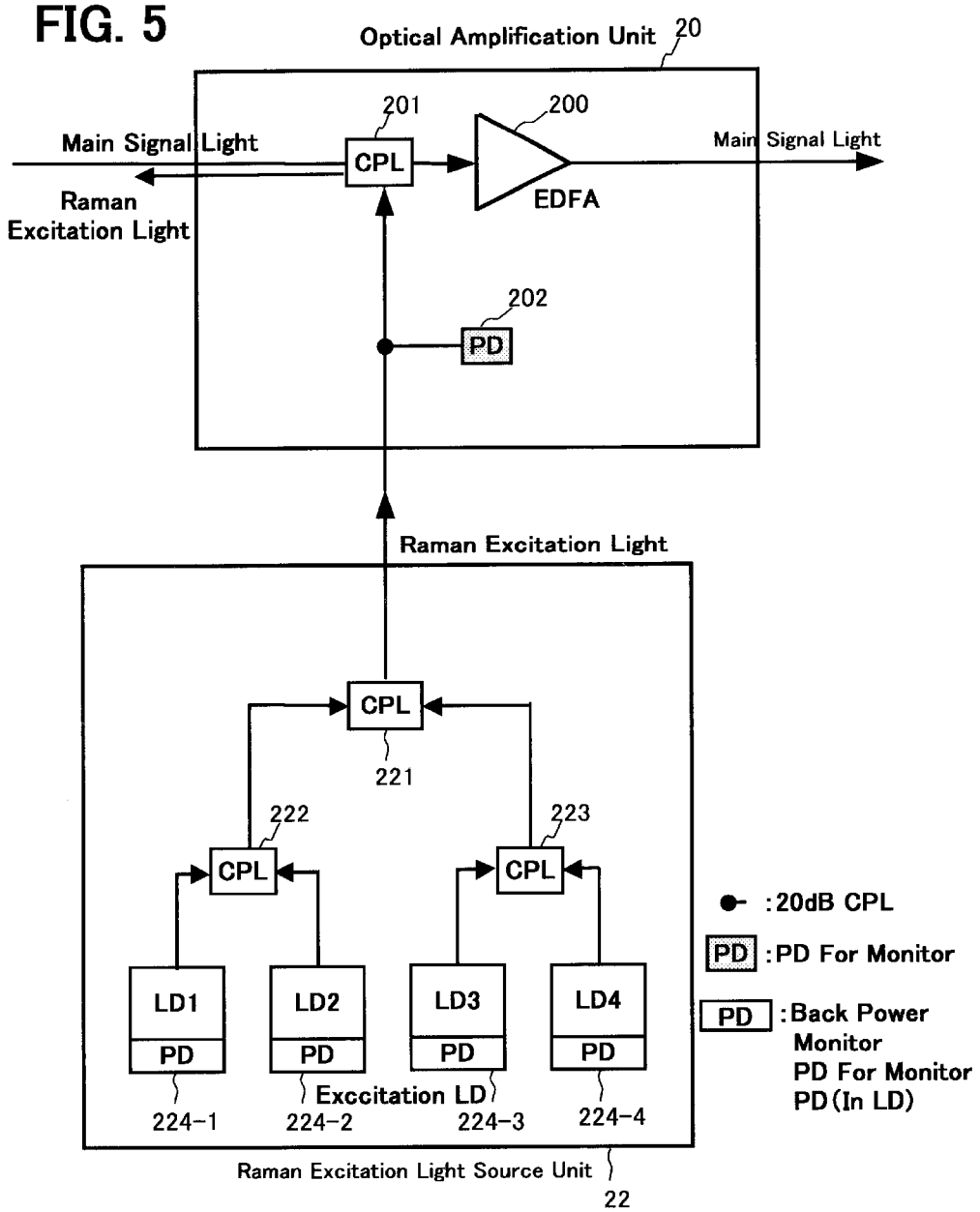
FIG. 5 shows a conceptual configuration according to an embodiment of the present invention.

FIG. 5 shows a conceptual configuration of an embodiment according to the present invention. One feature of the present invention is that, instead of using forward detection by means of photodetectors (PD) 224 to 227 shown in FIG. 4, back power monitors respectively provided in laser diodes (LD) are used for detecting backward output light.

More specifically, in the configuration shown in FIG. 5, photodetectors (PD) 224 to 227 and 220 provided in FIG. 4 for the use of forward detection of Raman excitation light source unit 22 are deleted. Instead, there are introduced back power monitors 224-1 to 224-4 respectively provided for detecting backward output light from laser diodes LD1 to LD4 for producing excitation light.

Figure 6:
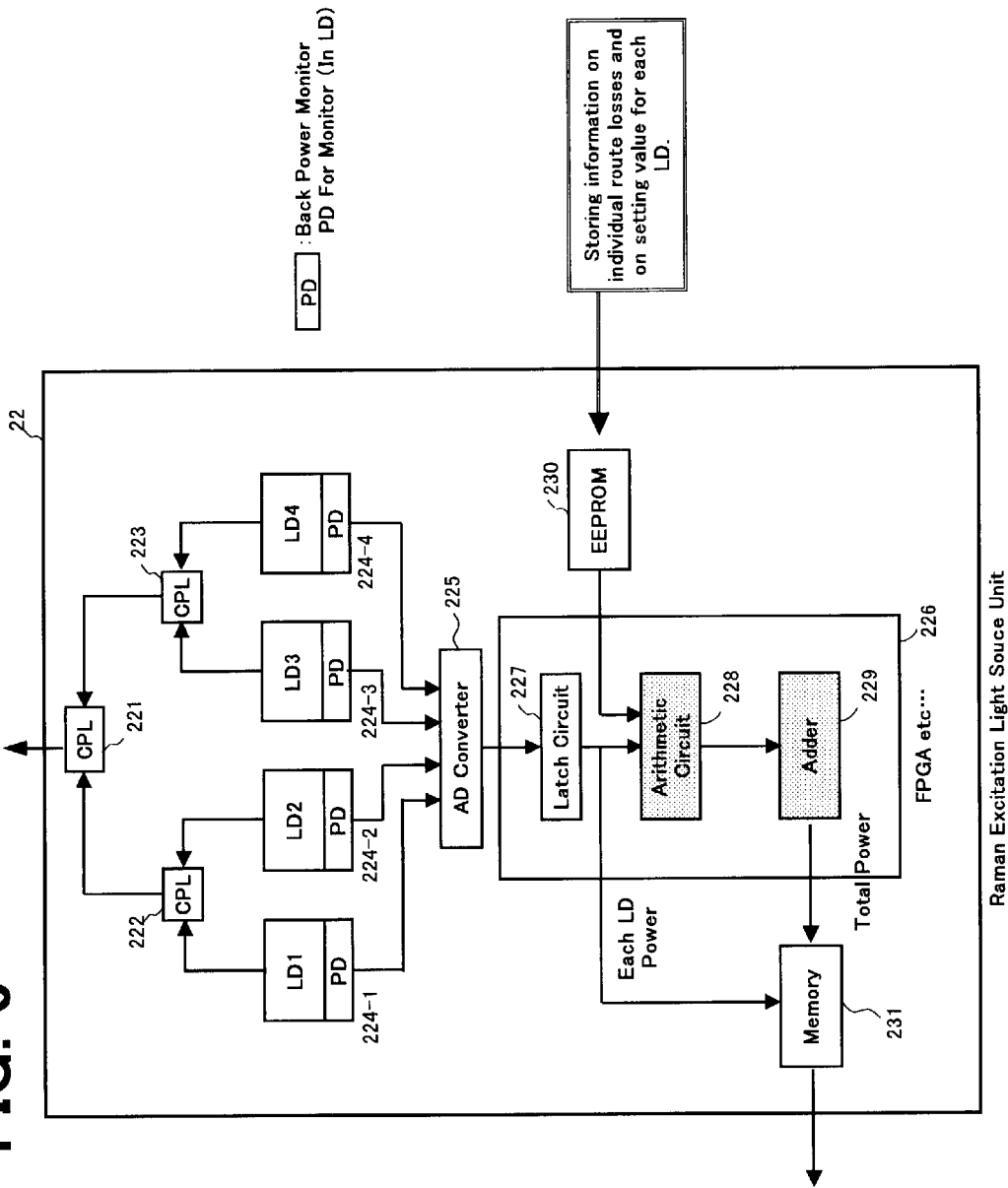
FIG. 6 shows a conceptual configuration of a Raman excitation light source unit which is controlled based on an optical detection signal detected by a back power monitor.

In FIG. 6, there is illustrated a configuration concept of Raman excitation light source unit 22 for the control based on light detection signal detected by back power monitors 224-1 to 224-4.

In FIG. 6, an analogue-to-digital converter (A/D converter) 225 is provided in Raman excitation light source unit 22, to convert a light detection signal input detected by back power monitors 224-1 to 224-4 into a digital signal.

As A/D converter 225, for example, LTC1290BCS, a product of Linear Technology Corporation, maybe used. This A/D converter 225 has a function of converting a plurality of parallelly input analogue signals into digital signals to output with time division.

An output of AD converter 225 is input to a latch circuit 227. In latch circuit 227, digital signals being input with time division corresponding to the outputs of back power monitors 224-1 to 224-4 are latched respectively.

Therefore, digital signals independently latched in latch circuit 227 corresponding to each back power monitor 224-1 to 224-4 are stored in a memory 231 as each output of laser diodes LD-1 to LD-4 for producing excitation light.

The contents of memory 231 are periodically read out by a non-illustrated system status supervision and display equipment for displaying the status.

The output of latch circuit 227 is further input to an arithmetic circuit 228. To this arithmetic circuit 228, there are also input an initial setting value based on the individual losses of each route and each characteristic of laser diodes LD1 to LD4 for producing excitation light being stored in externally erasable memory 230 (for example, an EEPROM; hereinafter simply referred to as EEPROM 230.)

Accordingly, in arithmetic circuit 228, the output of latch circuit is arithmetically corrected using the values stored in EEPROM 230. For example, the output power corresponding to back power monitors 224-1 to 224-4 latched in latch circuit 227 is corrected using the predetermined value of the route loss, to output-to an adder 229.

In adder 229, each corrected output level of laser diodes LD1 to LD4 for producing excitation light is added to store to memory 231 as a value of the total power of Raman excitation light. This data is also read out by the aforementioned status supervision and display equipment to display the status of optical amplification unit 20.

In Raman excitation unit 22 shown in FIG. 6, it is desirable for logic operation elements of an arithmetic circuit unit 226, which includes latch circuit 227, arithmetic circuit 228 and adder 229, to configure with field programmable gate array (FPGA) for modification by an external program.

This arithmetic circuit unit 226 configured with FPGA enables to cope with any modification either in optical signal bandwidths currently in use in a transmission line or channel assignment configurations for transmitting optical signals.

For example, in case optical signal bandwidth currently in use is to be increased, excitation lights having different wavelengths are newly added to expand Raman amplification gain bandwidths. For this purpose, addition of register stages is required for latching LD output level using latch circuit 227. When adding these registers, it is necessary to modify the configuration of arithmetic circuit 228 and adder 229. The use of FPGA enables such modification easily by external control.

Alternatively, it is also possible to use a microprocessor unit (MPU) instead of the FPGA. The same logical operation as performed by FPGA can be realized using a micro program.

Moreover, in FIG. 6, EEPROM 230 provides individual initial values corresponding to laser diodes LD1 to LD4 for producing excitation light, as well as loss information on the transmission line. In arithmetic circuit 228, individual correction value for each laser diode is calculated. Accordingly, it is possible to perform tilt correction against optical signal produced by a transmission line loss. Also, by setting a certain condition in a correction value, pre-emphasis control against the loss and SRS (stimulated Raman scattering) tilt becomes possible.

Figure 7:
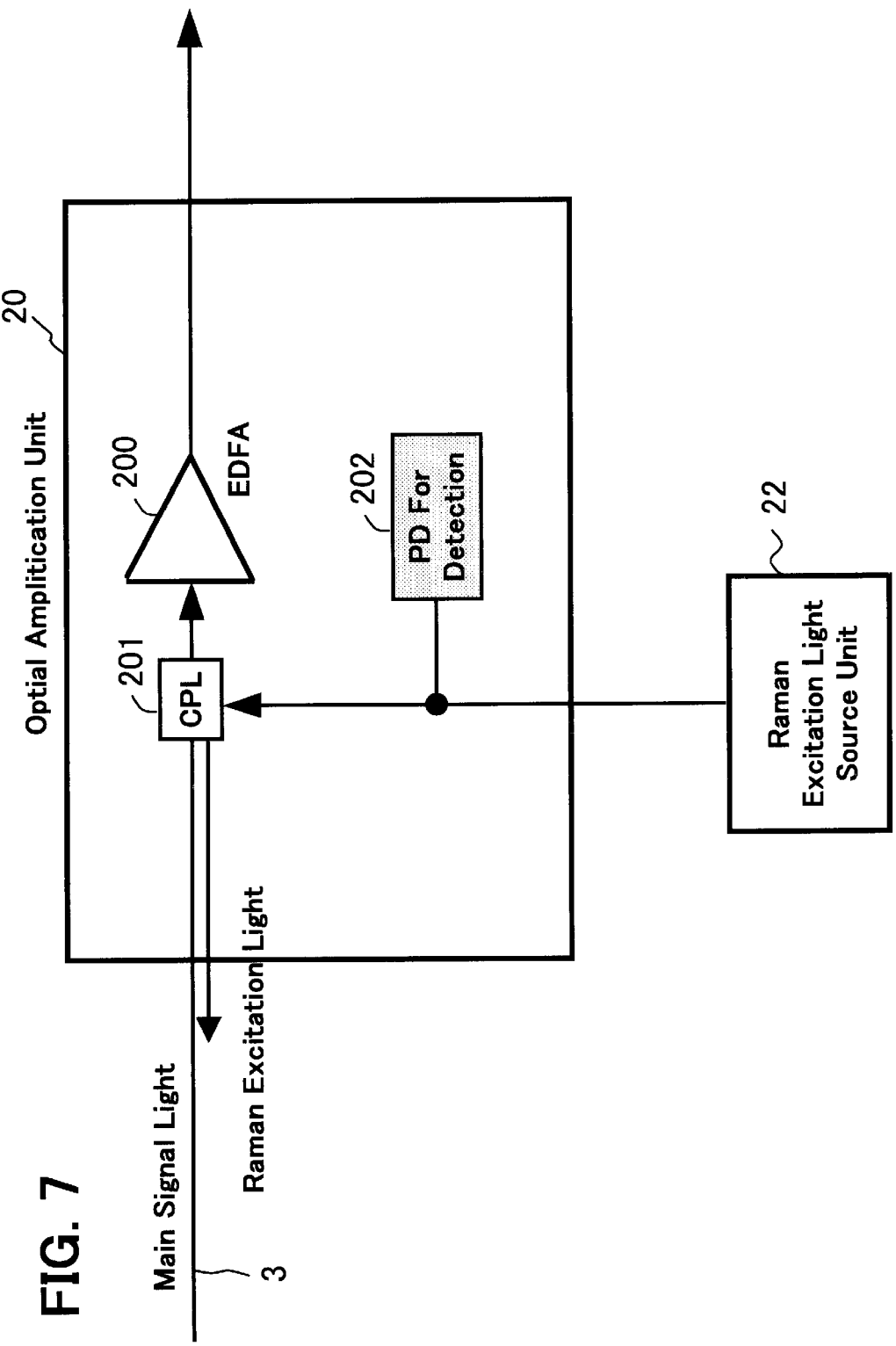
FIG. 7 shows a configuration example of a pre-amplifier unit which receives an excitation light output from Raman excitation light source unit shown in FIG. 6.

In FIG. 7, there is shown a configuration example of optical amplification unit 20, to which excitation light output from Raman excitation light source unit 22 shown in FIG. 6 is input. A coupler 201 is provided in the former stage of an optical amplifier 200. Raman excitation light from Raman excitation light source unit 22 is transmitted backward on transmission line 3 toward an optical amplification system in the previous stage.

In optical amplification unit 20, a photodetector (PD) 202 for break detection of Raman excitation light. This is used for controlling the level of Raman excitation light to maintain within the range of 0 to safety light level (in the order of several dBm.)

More specifically, when optical amplifier 200 is not initiated or a fiber to be connected to Raman excitation light source unit is not actually connected, the emission of Raman excitation light must be suspended for the sake of safety. For this purpose, break detection capability against Raman excitation light is provided using photodetector (PD) 202 for break detection.

As a typical example, photodetector (PD) 202 for break detection takes charge of monitoring the level up to the order of safety light level plus a certain margin α. For example, assuming the safety level is +5 dBm and α is 5 dBm, the upper limit of monitoring by photodetector (PD) 202 for break detection becomes +10 dBm (=10 mW). When 4 V is defined as the full range, the safety light level (approximately 3 to 5 dBm=2 to 3.2 mW) corresponds to 0.8 to 1.3 V. This level is not affected by noise and is applicable for accurate control.

Figure 8:
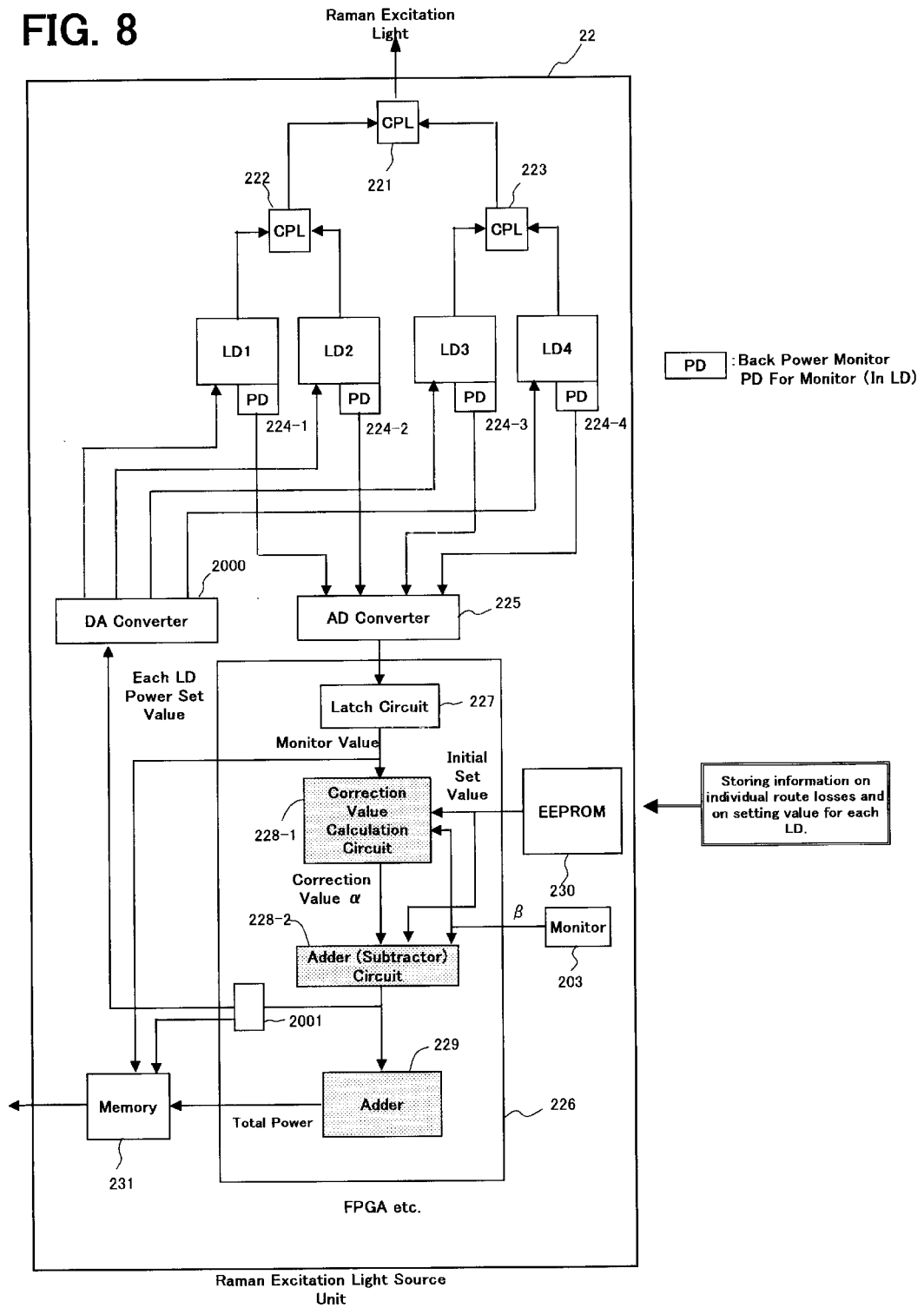
FIG. 8 shows an embodiment of the conceptual configuration of Raman excitation light source unit shown in FIG. 6.

In FIG. 8, there is shown an embodiment of conceptual configuration of Raman excitation light source unit 22 shown in FIG. 6. In this embodiment, a correction value calculation circuit 228-1 and an adder (subtracter) 228-2 are provided as arithmetic circuit 228 shown in FIG. 6.

In EEPROM 230, losses of individual routes and setting information of each LD are stored. These losses and setting information are input to correction value calculation circuit 228-1 and adder (subtracter) 228-2 as initial set values. In correction value calculation circuit 228-1, a difference α between the initial value and the monitored value set in latch circuit 227 is calculated as a correction value to output.

Then, the correction value a obtained by correction value calculation circuit 228-1 is input to adder (subtracter) 228-2 to perform correction operation (addition or subtraction) against the initial value.

In addition, a digital-to-analogue converter (D/A converter) 2000 is provided for setting current value of each laser diode LD1 to LD4 for producing excitation light according to the output of adder (subtracter) 228-2. Other operation is identical to those explained in FIG. 6.

More specifically, an initial power of each laser diode LD1 to LD4 for producing excitation light is set in EEPROM 230. When each power value of laser diodes LD1 to LD4 for producing excitation light (i.e. back power value detected by back power monitors 224-1 to 224-4) decreases against this initial value caused by aged deterioration, etc., a difference arises between the initial value obtained from EEPROM 230 and the power values of laser diodes LD1 to LD4 for producing excitation light being monitored by latch circuit 227. This difference α is calculated in correction value calculation circuit 228-1 to be a correction value.

Then, in adder (subtracter) 228-2, the difference α is superposed onto the initial value of LD drive current, to output as a new value set for each laser diode LD1 to LD4 for producing excitation light.

This new value set for each laser diode LD1 to LD4 for producing excitation light is input to D/A converter 2000. In D/A converter 2000, the control value for excitation light output of laser diodes LD obtained from arithmetic circuit unit 226 is converted to drive current control value for laser diodes LD1 to LD4 for producing excitation light. By controlling excitation LD drive current using the converted output value of D/A converter 2000, the light output produced by laser diodes LD1 to LD4 is controlled so as to become the set value.

As explained above, in the configuration shown in FIG. 8, the initial set value of each laser diodes LD1 to LD4 for producing excitation light is written in EEPROM 230 at an early stage. Accordingly, when the output of each laser diode LD1 to LD4 for producing excitation light decreases caused by temperature change, aged deterioration, etc., thus producing a difference α between the set value and the back power monitor value, it is possible to restore the excitation power to a desired value by controlling to drive laser diodes LD1 to LD4 for producing excitation light with a new value of adding the difference α to the initial set value.

Now, based on FIG. 9 in which the configuration shown in FIG. 8 is illustrated in more detail, a control method against either decrease or increase in the main signal level input to optical amplifier 200 is explained below.

Figure 9:
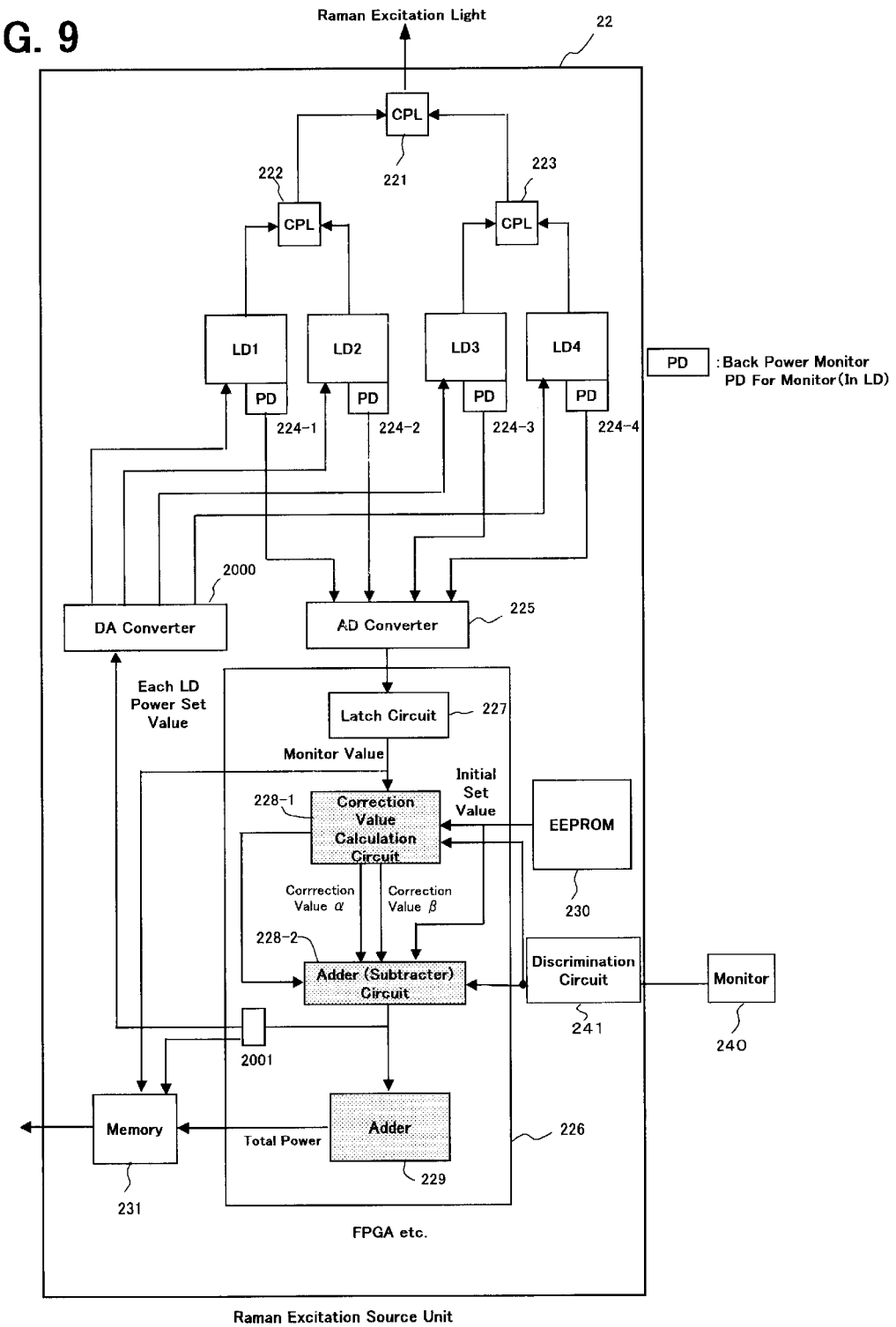
FIG. 9 shows a specific example of the configuration shown in FIG. 8.

In FIG. 9, variation of main signal input value is monitored by monitor circuit 240 (refer to FIG. 15) of optical amplification unit 20. The detection output is then input to a discrimination circuit 241. In discrimination circuit 241, the detection output input to monitor circuit 240 is compared with a predetermined threshold value to determine whether the main signal input level exceeds the upper or the lower limit. When the main signal input level exceeds the threshold values, a control signal is transmitted from discrimination circuit 241 to correction value calculation circuit 228-1 and adder (subtracter) 228-2.

Meanwhile, in correction value calculation circuit 228-1, correction value β corresponding to each laser diode LD1 to LD4 is calculated based on initial set power value of laser diodes LD1 to LD4 for producing excitation light being obtained from EEPROM 230. This procedure is explained in more detail later.

Accordingly, when the control signal indicating the main signal input level has exceeded the threshold value is input from discrimination circuit 241, correction value calculation circuit 228-1 forwards correction value β above obtained to adder (subtracter) 228-2.

In adder (subtracter) 228-2, when the control signal indicating the main signal input level has exceeded the threshold value is input from discrimination circuit 241, the correction value β is added to the, initial value obtained from EEPROM 230, to change each control value of laser diodes LD1 to LD4 for producing excitation light so that the input level of optical amplification unit 20 falls within the dynamic range. A specific control for making this input level fall within the dynamic range is explained later using FIG. 15.

Now, more detailed explanation regarding correction value β is given below. For example, the following are assumed: the gain is 10 dB in the transmission line when the total power of four-wave laser diodes LD1 to LD4 is +26 dBm (=398 nm); the gain varies 2 dB as a result of the excitation power changed by 100 mW, for example the gain becomes 8 dB when the excitation power is +24.7 dBm (=298 nm), or the gain becomes 12 dB when the excitation power is +27.0 dBm (=498 nm).

Then, the gradient of gain characteristic against the total LD output power becomes 2 dB/100 mW, or 0.02 dB/mW. When assuming the control step of 0.1 dB is chosen, β=5 mW may well be selected for addition/subtraction in accordance with the LD output variation of 0.1 dB. Here, the correction value per laser diode LD1 to LD4 for producing excitation light becomes 1.25 mW.

Figure 10:
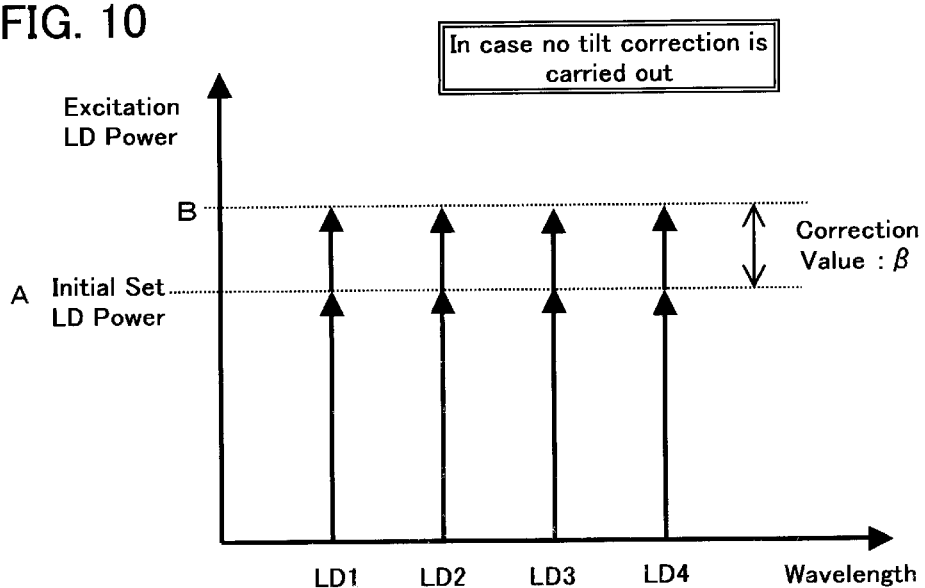
FIGS. 10A and 10B show a case in which a predetermined value β is subtracted or added without considering a tilt when the outputs of laser diodes LD1 to LD4 for producing excitation light are identical.

In FIG. 10, there is shown a case of adding/subtracting the above-mentioned correction value β when the main signal input level detected by monitor circuit 240 exceeds the threshold value, when each power output from laser diode LD1 to LD4 for producing excitation light is identical, and when a tilt in Raman gain is not taken into consideration.

Here, for each initial set LD power shown in FIG. 10A, a constant correction value β shown in FIG. 10B is obtained by correction value calculation circuit 228-1 shown in FIG. 9. The correction value β is input to adder (subtracter) 228-2 from correction value calculation circuit 228-1. In adder (subtracter) 228-2, this correction value β is added or subtracted to/from the initial set value obtained from EEPROM 230, to control the excitation power of laser diode LD1 to LD4 for producing excitation light.

The case shown above is based on the assumption that each output power of laser diode LD1 to LD4 for producing excitation light is identical. Now, another case is explained hereafter on controlling Raman gain to a constant value or a value with a predetermined tilt, when each output power of laser diode LD1 to LD4 is different depending on each characteristics. If a constant correction value β is either added or subtracted when each laser diode power is different, the power ratio of each laser diode becomes deviated and a tilt is produced. It is therefore necessary to adjust a different correction value β to be input to each diode laser corresponding to each initial power value of laser diodes LD1 to LD4 for producing excitation light.

Namely, in correction value calculation circuit 228-1, each initial power value of laser diodes LD1 to LD4 for producing excitation light is divided by a constant (i.e. multiplied by ½$^n$) where n is predetermined so that the result becomes near to the control step (for example, 1 mW) to obtain independent correction values β for respective laser diodes LD1 to LD4 for producing excitation light in advance. When the control signal is input from discrimination circuit 241 requesting a control, the correction values β are applied for respective laser diodes LD1 to LD4 for producing excitation light. Thus the tilt can be eliminated by adding (or subtracting) the correction values β to (from) the values in latch circuit 227 corresponding to respective laser diodes LD1 to LD4 for producing excitation light.

Figure 11:
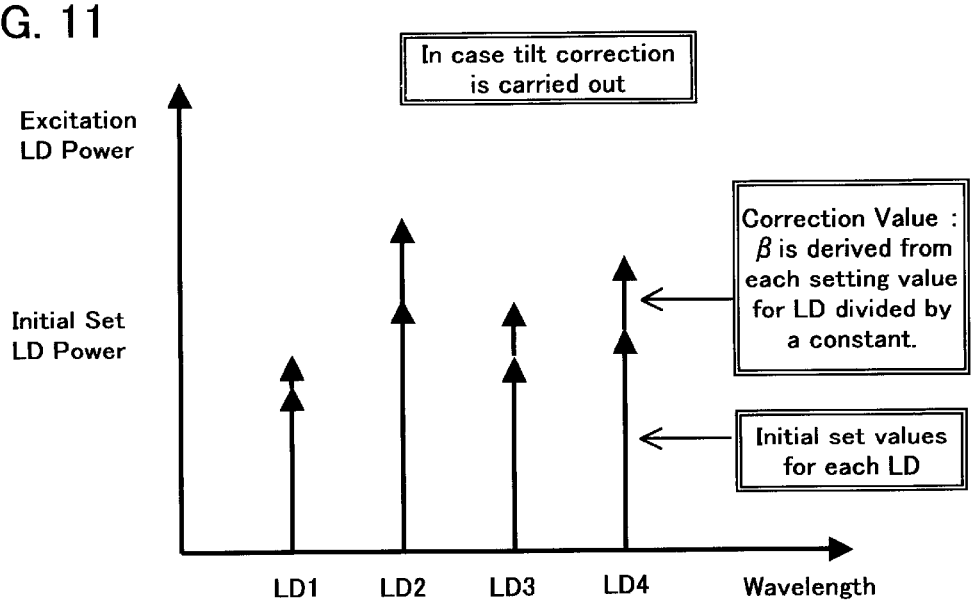
FIG. 11 shows a typical method for obtaining the value β.

Referring to FIG. 11, a specific example for obtaining these correction values β is illustrated hereafter.

In FIG. 11, the initial power values are assumed as follows for each laser diode LD1 to LD4 for producing excitation light:

LD1:150 mW=(21.8 dBm)
LD2:250 mW=(24.0 dBm)
LD3:200 mW=(23.0 dBm)
LD4:220 mW=(23.4 dBm)

A rough figure for correction values β to be added to each laser diode LD1 to LD4 output from EEPROM 230 is obtained from a relation between the excitation power volume and the gain. Here, it is assumed to be approximately 1 mW. Because it is easy to handle using $2^n$ in digital division, n=8 is used here to obtain the division result becoming near to 1 mW.

Thus, the following correction values β are obtained by dividing the above power values by $2^8=256$.

$\beta_1$ (for LD1)=0.59 mW
$\beta_2$ (for LD2)=0.98 mW
$\beta_3$ (for LD3)=0.78 mW
$\beta_4$ (for LD4)=0.86 mW Using these correction values, the tilt which may have produced when adding an identical constant value can be corrected.

Now, hereinafter a case is explained in which power allocation of each laser diode LD is changed corresponding to variation in the number of main signal wavelengths resulting from wavelength expansion or abolishment, or variation in signal location (whether signals exist in respective channels CH1 to CHn).

In the above explanation on the embodiment, laser diodes LD1 to LD4 for producing excitation light is dedicatedly mentioned. However, the case is not limited to these four laser diodes. The correction may also be carried out in such a manner as is based on the laser diodes being selected and set currently in use corresponding to the wavelengths out of a plurality of laser diodes.

Figure 12:
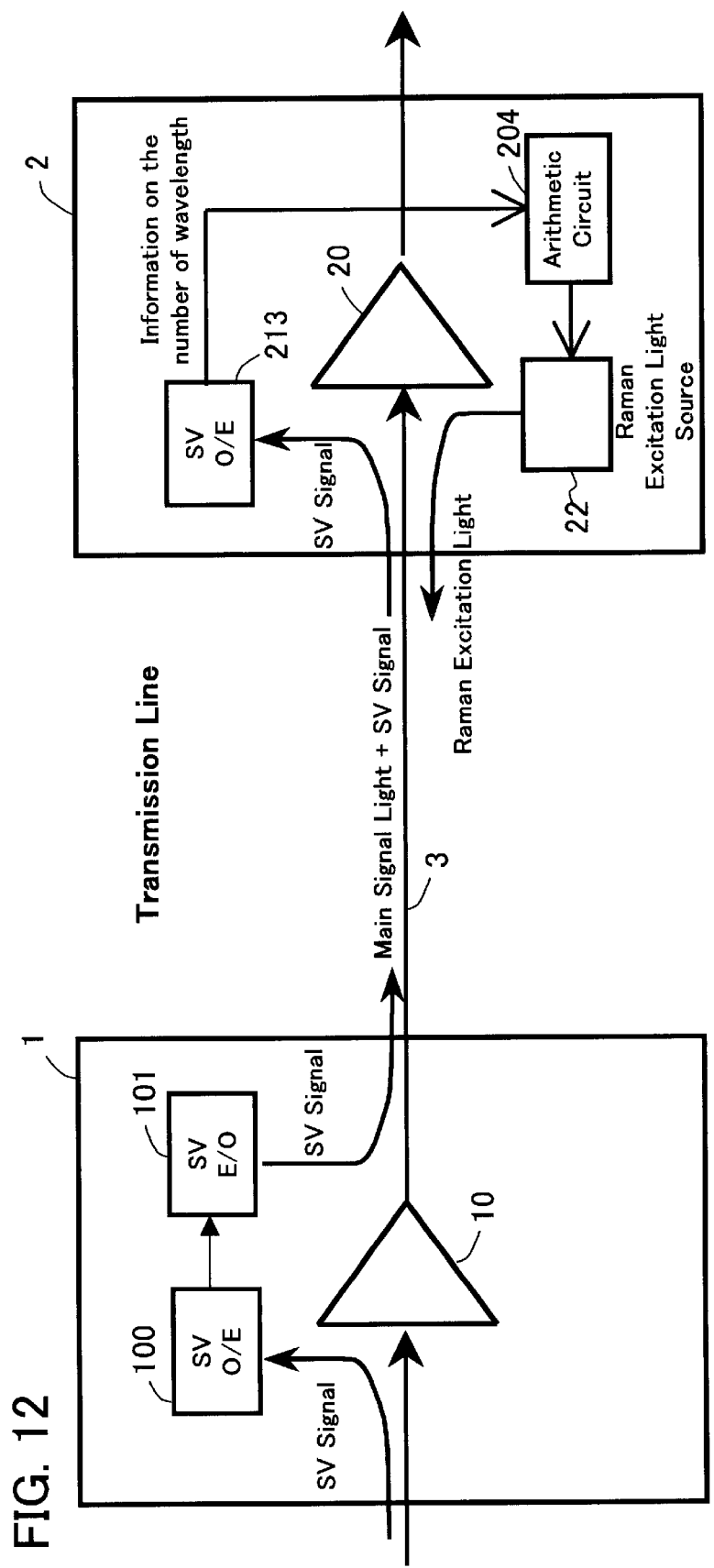
FIG. 12 show a method of the transmission of wavelength information currently used.

In FIG. 12, a chart is shown in regard to the transmission of wavelength information being used. An SV (supervision) signal is transmitted on transmission line 3, as well as a main signal. As an example, the main signal is formed of wavelength signals having 1.53 to 1.56 μm, while the SV signal is formed of a wavelength signal having 1.51 μm.

In optical amplification system 1, an SV signal transmitted from upstream is received and separated by an SV signal reception circuit 100. The SV signal is then fed in toward optical amplification system 2 through an SV signal transmission circuit 101. In optical amplification system 2, information on the number of wavelengths and channel information are extracted from the SV signal received and separated by an SV signal reception circuit 213.

This information on the number of wavelengths and channel information are indicated with flag bits being set on the corresponding wavelength positions currently in use. These flags are provided in a specified area allocated for the SV signals having a capacity of 193 bits×24.

Example 1
In Case CH1, 3, 4, 5 are the Channels Being Used

| CH1 | CH2 | CH3 | CH4 | CH5 | CH6 | ... | CH30 | CH31 | CH32 | ... | CHn-1 | CHn |
|---|---|---|---|---|---|---|---|---|---|---|---|---|
| 1 | 0 | 1 | 1 | 1 | 0 | ... | 0 | 0 | 0 | ... | 0 | 0 |

Example 2
In Case CH2, 6, 30, 31, 32 are the Channels Being Used

| CH1 | CH2 | CH3 | CH4 | CH5 | CH6 | ... | CH30 | CH31 | CH32 | ... | CHn-1 | CHn |
|---|---|---|---|---|---|---|---|---|---|---|---|---|
| 0 | 1 | 0 | 0 | 0 | 1 | ... | 1 | 1 | 1 | ... | 0 | 0 |

Such information on the number of wavelengths and channel information of the SV signals are extracted in arithmetic circuit 204, to modify the values having been obtained from either correction value calculation circuit 228-1 or EEPROM 230 provided in Raman excitation light source unit 22 shown in FIG. 8 and FIG. 9. After this, the operation of the embodiment previously explained is carried out.

In FIG. 13, another embodiment in regard to wavelength information transmission being in use is illustrated. In the system shown in FIG. 13, spectrum analyzers 102 and 205 are provided in optical amplification system 1 and optical amplification system 2, respectively.

In these spectrum analyzers 102, 205, existence of each wavelength is monitored using a multiplexed signal branched from a portion of main signal being separated into each wavelength using a diffraction grating. Based on the monitored output of spectrum analyzers 102, 205, measuring the signal powers of each channel and optical signal-to-noise ratio (ONSR) becomes possible in arithmetic circuit 204, as well as obtaining the wavelength information.

Then, the output of arithmetic circuit 204 is fed back to Raman excitation light source 22 to set to latch circuit 227 and EEPROM 230. Thus the tilt control and pre-emphasis control can be carried out.

Figure 14A:
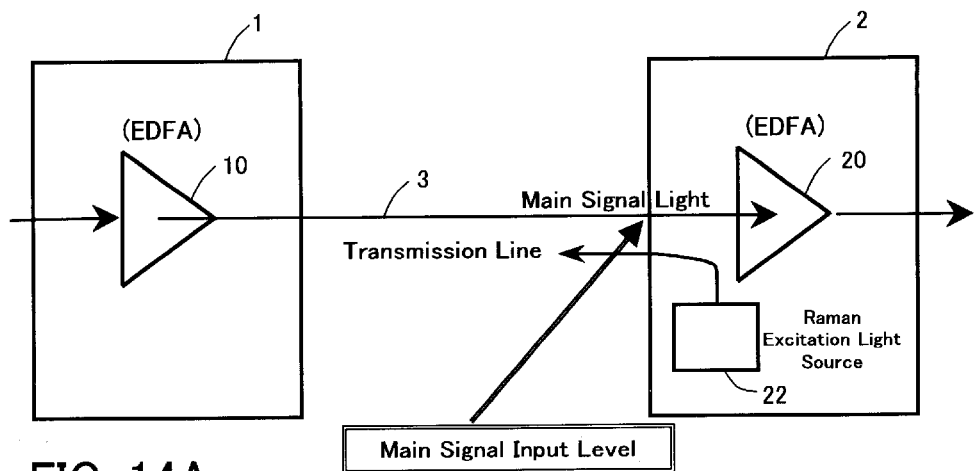
FIGS. 14A and 14B show the relation between an input dynamic range and an input level.
Figure 14B:
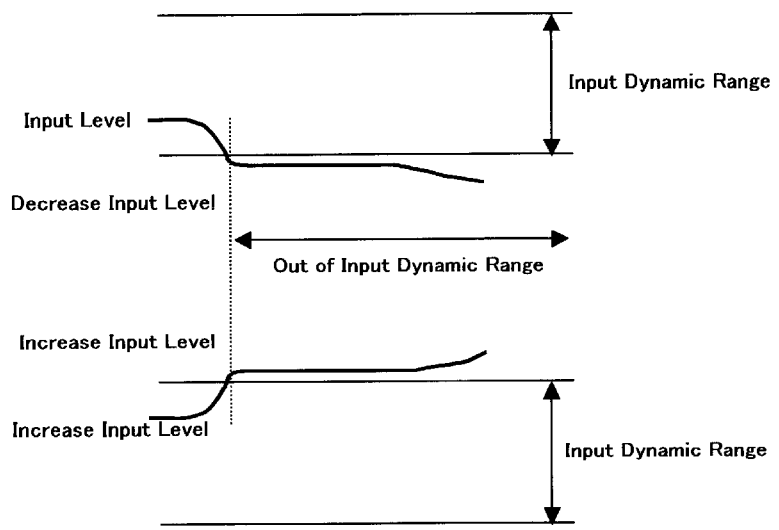

In FIGS. 14A and 14B, there is shown a diagram, illustrating a relation between an input dynamic range and an input level of an optical amplifier. In FIG. 14A, attention is paid to the input level of optical amplification unit 20 of optical amplification system 2 optical amplification unit 20 normally has a dynamic range of several dB. There is a case, however, that the main signal level input to optical amplification unit 20 deviates out of this input dynamic range because of a failure either on optical amplification unit 10 in optical amplification system 1 or transmission line 3, etc.

More specifically, as shown in FIG. 14B, there are cases that an input level is decreased below the minimum value in the dynamic range, or an input level is increased above the maximum value in the dynamic range.

Such input signal deviating out of the input dynamic range produces a problem of deterioration in signal-to-noise ratio. It is therefore necessary to control Raman excitation light.

Figure 15:
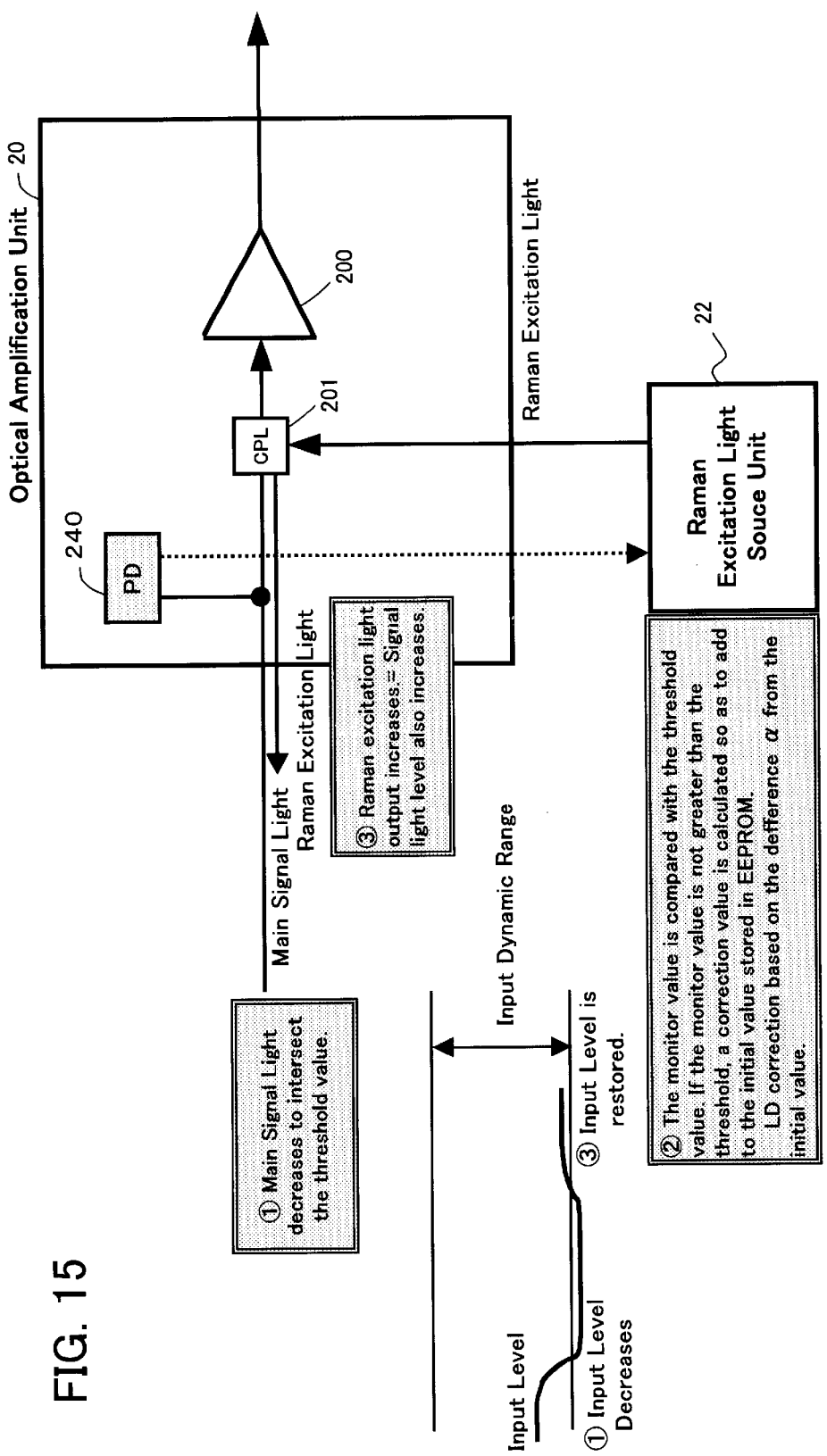
FIG. 15 shows a procedure for controlling Raman excitation light according to the present invention in case an input signal level decreases.

In FIG. 15, there is illustrated a control procedure for Raman excitation light according to the present invention in case of a decreased input signal level.

When the input signal level of main signal light decreases to fall down below the lower limit of the threshold of input dynamic range (step ①), this fact is detected by monitor circuit 240 functioning as a main signal detector. Then, as previously described in regard to FIG. 9, the detected output of monitor circuit 240 is compared with the threshold value in discrimination circuit 241 (refer to FIG. 9). As a result of this comparison, if the input level of main signal light is below the lower limit of the threshold, the correction value β calculated in correction value calculation circuit 228-1 is added to each measured, power value of laser diodes LD1 to LD4 for producing excitation light, as previously explained using FIG. 9.

Further, in adder (subtracter) 228-2, the correction value α is added (or subtracted). Here, α is a difference between the initial power value and measured value of laser diodes LD1 to LD4 for producing excitation light. The result of this addition (subtraction) is reflected through D/A converter 2000 to perform feedback control (automatic power control). (step ②)

As a result, the Raman excitation light output increases producing an increase of input signal level (step ③). Thus the input level is restored within the input dynamic range.

Figure 16:
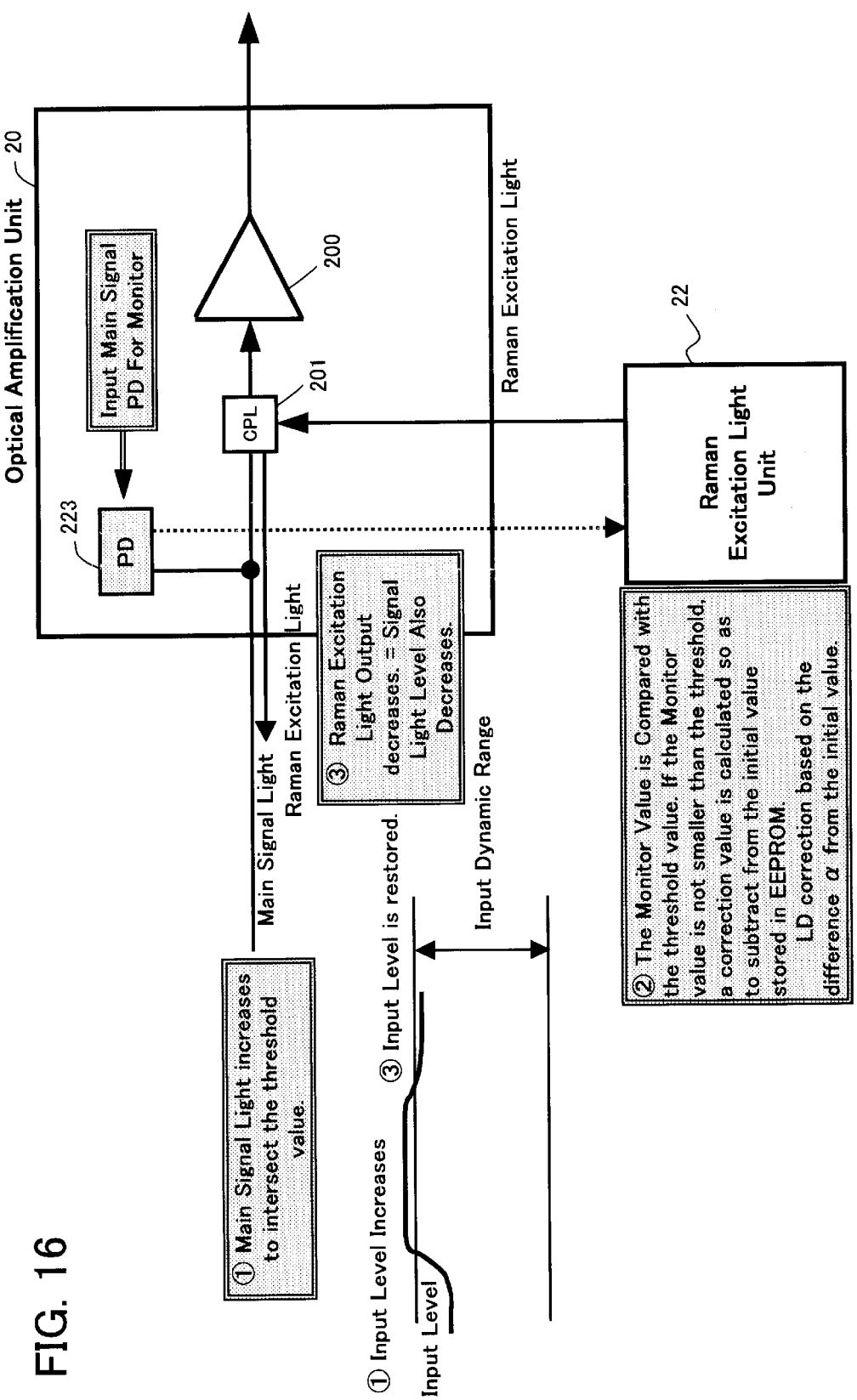
FIG. 16 shows a procedure for controlling Raman excitation light according to the present invention in case an input signal level increases.

In FIG. 16, an opposite case, i.e. the input signal level is increased is shown, illustrating a control procedure for Raman excitation light in accordance with the present invention.

When the input signal level of main signal light increases to exceed the upper limit of the threshold of input dynamic range (step ①), this is detected by monitor circuit 240, to compare with the threshold value in discrimination circuit 241 (refer to FIG. 9). As a result of this comparison, if the input level of main signal light exceeds the upper limit of the threshold, the correction value β calculated in correction value calculation circuit 228-1 is subtracted from each measured power value of laser diodes LD1 to LD4 for producing excitation light. Further, in adder (subtracter) 228-2, the correction value α, which is a difference between the initial power value and measured value of laser diodes LD1 to LD4, is subtracted (or added). The result of this subtraction (addition) is reflected through D/A converter 2000 to perform feedback control (automatic power control). (step ②)

As a result, the Raman excitation light output decreases producing a decrease of input signal level (step ③). Thus the input level is restored within the input dynamic range.

By repeating the procedure shown in FIGS. 15, 16, the input level is enabled to maintain in substantially constant value within the input dynamic range.

Figures 17A, 17B:
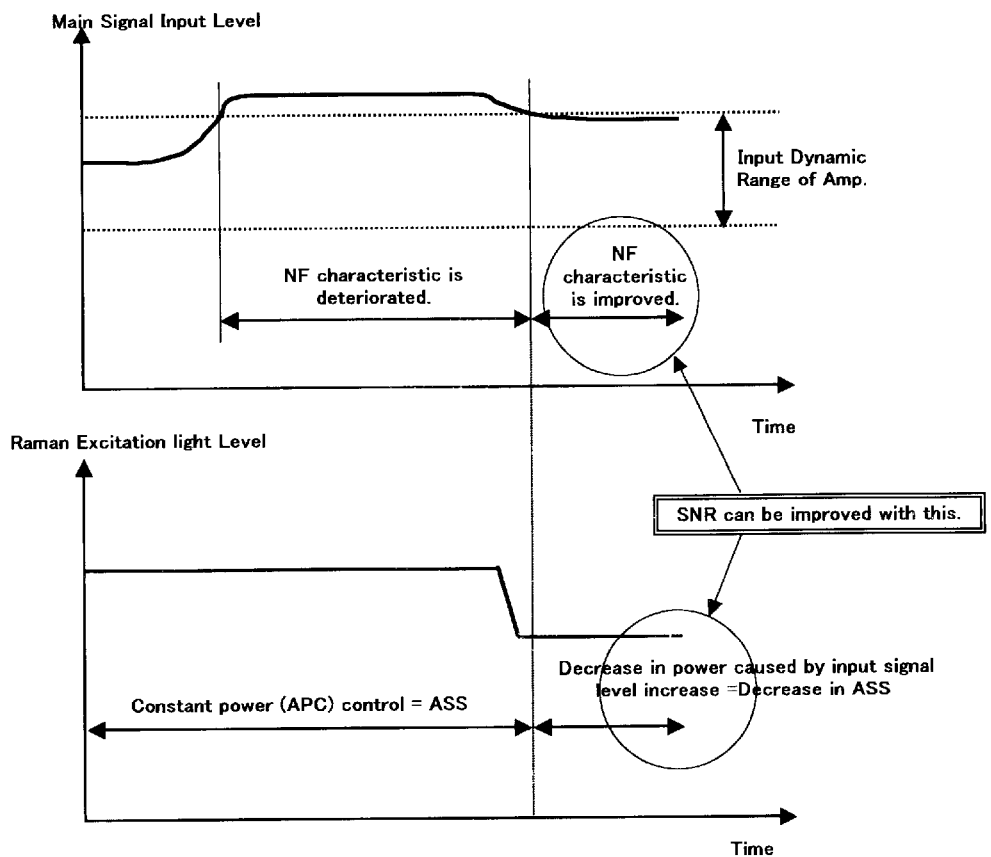
FIGS. 17A and 17B show an example of improved signal-to-noise characteristic according to the present invention.

In FIGS. 17A and 17B, there is shown an example of improving signal-to-noise ratio according to the present invention.

As shown in FIG. 17A, ASS (amplified spontaneous scattering) noise produced correspondingly to the Raman excitation light intensity is constant while the Raman excitation light power is maintained constantly. However, when the input signal level exceeds the upper limit of the dynamic range, the signal-to-noise ratio (SNR) is relatively deteriorated to the deterioration of the noise figure (NF),of optical amplifier 200.

Therefore, when the excitation power is decreased as shown in FIG. 17B, the main signal level, as well as ASS, is decreased to become within the dynamic range. Accordingly the noise figure (NF) is also decreased and, as a result, the noise can be reduced.

On the other hand, when the input signal level is decreased below the lower limit of the dynamic range, the noise figure (NF) of optical amplifier 200 is simply deteriorated as long as the Raman excitation power is kept constant, thus producing a deterioration in the signal-to-noise ratio (SNR).

In such a condition, if the excitation power is increased, the ASS is also increased. However, because the main signal power input to the amplifier becomes within the dynamic range, the noise figure (NF) is reduced.

Here, in order to cancel the effect of increased ASS, the following method is introduced: first, obtaining the relation of ASS in Raman excitation light and amplified spontaneous emission (ASE) in optical amplifier 200 against main signal input level through a transmission experiment or simulation; with this relation, obtaining an optimal level producing no deterioration in signal-to-noise ratio (SNR); then setting the lower level of the dynamic range of the optical amplifier.

Figure 18:
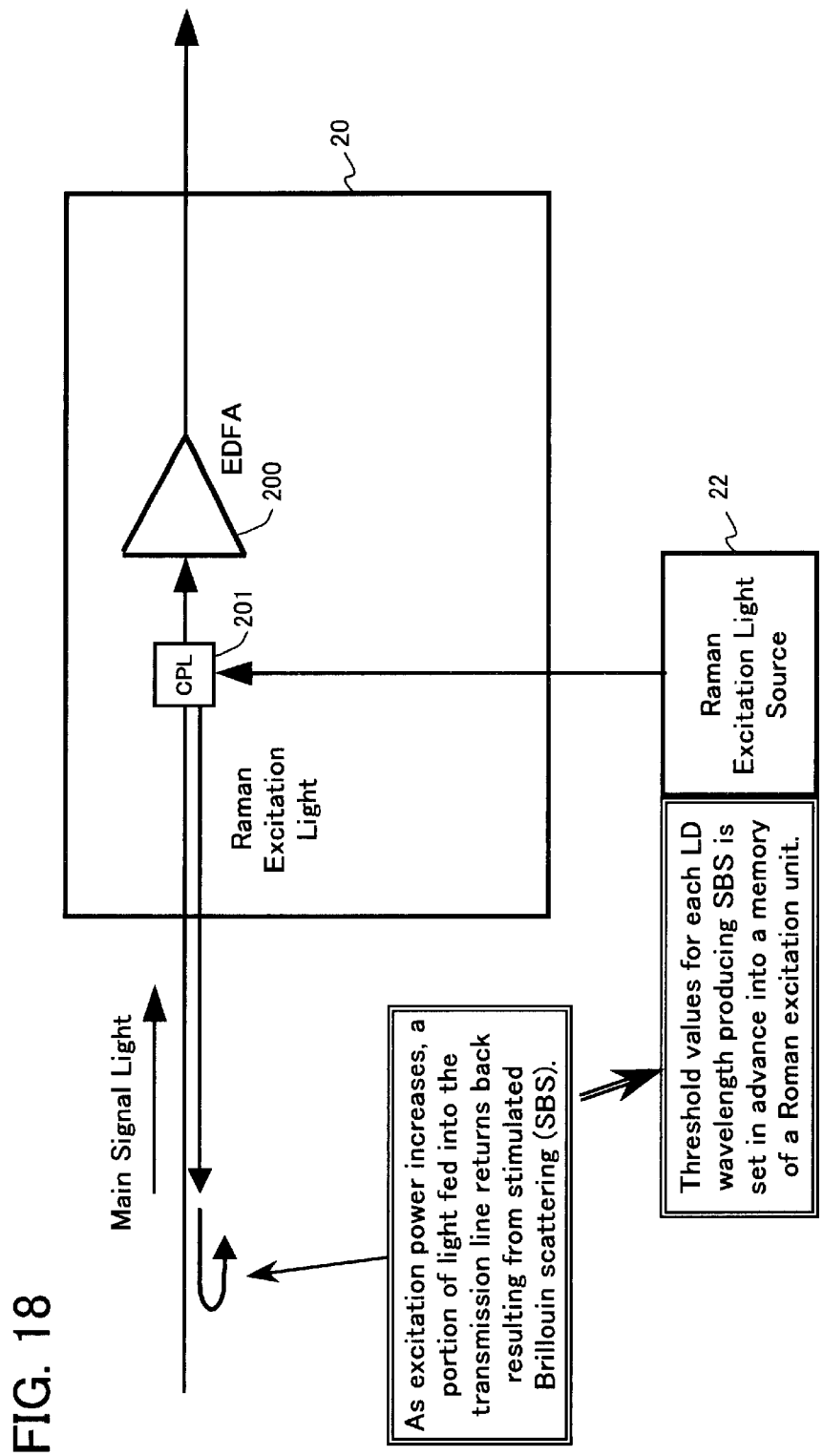
FIG. 18 shows a back light produced by the stimulated Brillouin scattering (SBS).

Also, when the output power of laser diodes LD1 to LD4 for producing excitation light is increased in case the signal level falls below the lower limit of the dynamic range, stimulated Brillouin scattering (SBS), which is a kind of non-linear phenomenon, appears in the excitation light. As illustrated in FIG. 18, because of the stimulated Brillouin scattering (SBS), a part of the excitation light having been input returns, producing noise light against the main signal light.

In order to avoid this phenomenon, a threshold level against the appearance of stimulated Brillouin scattering (SBS) is set in advance in a drive control circuit 2001 provided in arithmetic circuit unit 226 between adder 228-2 and D/A converter 2000.

Drive control circuit 2001 compares the output from adder 228-2 with the threshold value of the start of the stimulated Brillouin scattering (SBS) produced in the excitation light in the transmission line. When the output exceeds the threshold value of the start of the stimulated Brillouin scattering (SBS), Drive control circuit 2001 indicates D/A converter 2000 to maintain the output of adder 228-2 in the value before exceeding the threshold value. At the same time, the fact that D/A converter 2000 was controlled on the point of exceeding the threshold value is recorded in memory 231.

The value recorded in memory 231 is read out into the status supervision and display equipment to display an abnormal condition has occurred in the equipment. Further, the supervision control signal transmission equipment reports this condition to the amplifiers and the terminal stations located downstream. This enables to eliminate the generation of the stimulated Brillouin scattering (SBS)

In addition, with regard to the threshold value to be set in drive control circuit 2001, it may also be possible to set a value corresponding to the tolerance value to the current capacity of the drive circuit of laser diodes LD1 to LD4 for producing excitation light. In this manner, drive circuits of laser diodes LD1 to LD4 can be prevented from breakdown.

Laser diodes LD1 to LD4 for producing excitation light may possibly break down at the time of initiation caused by no input supplied to A/D converter 225 producing abrupt increase in output. Otherwise, even if the above-mentioned breakdown is avoided, the input/output monitor terminal in the optical amplifier or the light receiving element in SV signal receiving circuit 2000 may possibly break down caused by an overshoot of the excitation light. The overshoot produces a power input having extremely beyond tolerable optical power into the optical amplifier in the succeeding stage. In order to prevent such a condition, drive control circuit 2001 indicates the change amount received from the adder to D/A converter 2000 step by step.

More specifically, drive control circuit 2001 stores a control value previously informed to D/A converter to compare with a new control value. When the difference therebetween exceeds a predetermined value, the control value to be supplied to D/A converter 2000 is increased gradually till the required new control value is supplied. Here, the above-mentioned predetermined value is obtained from the value of producing a breakdown in either the laser diodes, the optical amplifiers, the light receiving elements for monitoring in the SV signal reception circuit, or the like.

For this purpose, a control circuit for gradual increasing is provided. It is desired to determine an optimal transit time of this control circuit for gradual increasing in consideration of the time constant of the drive circuit for laser diodes LD1 to LD4, a required rise-up time of the equipment, etc.

Furthermore, in the embodiments illustrated above, backward excitation is taken as an example of the excitation method. However, it may also be possible to use a forward excitation method, or both backward and forward excitation methods.

To summarize, the following effects can be obtained according to the present invention:

(1) A multiple of couplers and photodetectors (PD) can be reduced, enabling cost reduction of the unit.
(2) Power consumption by a monitor out of the output of laser diodes can be reduced, enabling to obtain higher power excitation light. Alternatively, this enables to decrease required emission light power to be generated by the laser diodes.
(3) Accurate control can be achieved by adjusting a back power in an analogue manner (photodetector PD can be adjusted so as to output a certain voltage under a certain input power), enabling to absorb the dispersion in individual monitor values.
(4) By allotting a function of monitoring only low power area near the safety optical level in photodetector PD located in a pre-amplifier side for break detection, the dynamic range of photodetector PD can be set narrow, enabling to monitor in safety optical level with greatly improved accuracy.
(5) Because a back power monitor is configured with a simple structure having only a photodetector backward to a laser diode, the number of components can be reduced, also enabling to control in a closed area around the laser diode. This greatly improves the monitor reliability compared to a monitoring method with a photodetector positioned forward.
(6) It is possible to maintain the input level within the dynamic range by controlling to change the Raman amplification gain when the input signal level to a pre-amplifier is about to deviate from the dynamic range. This enables to prevent deterioration in transmission quality, and to extend virtually the dynamic range of the pre-amplifier.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A Raman excitation control method comprising:

detecting, with a back power monitor circuit, backward lights produced by, and output in a backward direction from, a laser diode circuit producing Raman excitation light provided to an optical transmission line to thereby cause Raman amplification to occur in the optical transmission line; and controlling light emission power of the Raman excitation light produced by the laser diode circuit according to level of the backward lights detected by the back power monitor circuit.

2. The Raman excitation control method according to claim 1, wherein the laser diode circuit includes a plurality of laser diodes, which produce Raman excitation lights having respectively different wavelengths, and in said detecting, the back power monitor circuit detects backward lights produced by the plurality of laser diodes; and in said controlling, light emission power of Raman excitation light of each of the laser diodes is controlled according to each of the backward lights detected.

3. A Raman excitation control method comprising:

detecting, with a power monitor, backward light produced by, and output in a backward direction from, a laser diode producing Raman excitation light provided to an optical transmission line to thereby cause Raman amplification to occur in the optical transmission line;

comparing a power value of the backward light detected by the power monitor with an initial set data for the laser diode stored in a memory; and controlling light emission power of the Raman excitation light produced by the laser diode according to the result of the comparison.

4. The Raman excitation control method according to claim 3, wherein the initial set data indicates an initial power of the laser diode, and in said comparing, a difference value is obtained between the initial power and a power value of the backward light detected by the power monitor; and in said controlling, light emission power of the Raman excitation light produced by the laser diode is controlled by using the difference value added to the initial power value.

5. A Raman excitation control method comprising:

detecting, with a power monitor, backward lights produced by a plurality of laser diodes producing Raman excitation lights provided to an optical transmission line to thereby cause Raman amplification to occur in the optical transmission line;

comparing respective power values of backward lights detected by the power monitor with initial set data stored in a memory corresponding to each of the plurality of laser diodes; and controlling light emission power of the Raman excitation light produced by each of the plurality of laser diodes according to the result of the comparison.

6. The Raman excitation control method according to claim 5, wherein the initial set data indicates each initial power of the plurality of laser diodes, and in said comparing, difference values between each of the initial power of the plurality of laser diodes and each of the power value detected by the power monitor are obtained, and in said controlling, the light emission powers of the Raman excitation lights of the plurality of laser diodes are controlled by using the difference values added to the initial power values corresponding to the plurality of laser diodes, respectively.

7. A Raman excitation control system comprising:
a back power monitor circuit detecting backward lights produced by, and output in a backward direction from, a laser diode circuit producing Raman excitation light provided to an optical transmission line to thereby cause Raman amplification to occur in the optical transmission line; and
a control circuit controlling light emission power of the Raman excitation light produced by the laser diode circuit according to level of the backward lights detected by the back power monitor circuit.

8. The Raman excitation control system according to claim 7, wherein the laser diode circuit includes a plurality of laser diodes, which produce Raman excitation lights having respectively different wavelengths,
wherein the back power monitor circuit detects backward lights produced by the plurality of laser diodes, and light emission power of Raman excitation light produced by each laser diode is controlled according to backward light of the respective laser diode detected by the power monitor circuit.

9. A method of controlling a laser diode producing excitation light provided to an optical transmission line to cause Raman amplification to occur in the optical transmission line, the method comprising:
controlling the laser diode in accordance with a level of backward light produced by, and output in a backward direction from, the laser diode, to control light emission power of the excitation light produced by the laser diode.

10. An apparatus for controlling a laser diode producing excitation light provided to an optical transmission line to cause Raman amplification to occur in the optical transmission line, the apparatus comprising:
a controller controlling the laser diode in accordance with a level of backward light produced by, and output in a backward direction from, the laser diode, to control light emission power of the excitation light produced by the laser diode.

11. An apparatus comprising:
a laser diode producing excitation light provided to an optical transmission line to cause Raman amplification to occur in the optical transmission line; and
means for controlling the laser diode in accordance with a level of backward light produced by, and output in a backward direction from, the laser diode, to control light emission power of the excitation light produced by the laser diode.

12. A method comprising:
detecting backward light produced by, and output in a backward direction from, a laser diode producing excitation light provided to an optical transmission line to cause Raman amplification to occur in the optical transmission line; and
controlling the laser diode in accordance with a level of the detected backward light to control light emission power of the excitation light produced by the laser diode.

13. An apparatus comprising:
a detector detecting backward light produced by, and output in a backward direction from, a laser diode producing excitation light provided to an optical transmission line to cause Raman amplification to occur in the optical transmission line; and
a controller controlling the laser diode in accordance with a level of the detected backward light to control light emission power of the excitation light produced by the laser diode.

14. A method comprising:
detecting a power level of backward light produced by, and output in a backward direction from, a laser diode producing excitation light provided to an optical transmission line to cause Raman amplification to occur in the optical transmission line;
comparing the detected power level with stored data indicating an initial power level, to thereby produce a comparison result; and
controlling the laser diode in accordance with the comparison result to thereby control light emission power of the excitation light produced by the laser diode.

15. An apparatus comprising:
a detector detecting a power level of backward light produced by, and output in a backward direction from, a laser diode producing excitation light provided to an optical transmission line to cause Raman amplification to occur in the optical transmission line;
a comparator comparing the detected power level with stored data indicating an initial power level, to thereby produce a comparison result; and
a controller controlling the laser diode in accordance with the comparison result to thereby control light emission power of the excitation light produced by the laser diode.

16. A method comprising:
detecting backward lights produced by, and output in a backward direction from, laser diodes producing excitation lights provided to an optical transmission line to cause Raman amplification to occur in the optical transmission line; and
controlling the laser diodes in accordance with levels of the detected backward lights to control light emission powers of the excitation lights produced by the laser diodes.

17. An apparatus comprising:
a detector detecting backward lights produced by, and output in a backward direction from, laser diodes producing excitation lights provided to an optical transmission line to cause Raman amplification to occur in the optical transmission line; and
a controller controlling the laser diodes in accordance with levels of the detected backward lights to control light emission powers of the excitation lights produced by the laser diodes.

18. An apparatus comprising:
a detector detecting backward lights produced by, and output in a backward direction from, laser diodes producing excitation lights provided to an optical transmission line to cause Raman amplification to occur in the optical transmission line; and
means for controlling the laser diodes in accordance with levels of the detected backward lights to control light emission powers of the excitation lights produced by the laser diodes.

* * * * *